United States Patent
Nishimura (10) Patent No.: US 11,283,423 B2
(45) Date of Patent: Mar. 22, 2022

(54) RESONATOR AND RESONANCE DEVICE

(71) Applicant: Murata Manufacturing Co., Ltd., Nagaokakyo (JP)

(72) Inventor: Toshio Nishimura, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 267 days.

(21) Appl. No.: 16/804,075

(22) Filed: Feb. 28, 2020

(65) Prior Publication Data

US 2020/0204149 A1    Jun. 25, 2020

Related U.S. Application Data

(63) Continuation of application No. PCT/JP2018/018121, filed on May 10, 2018.

(30) Foreign Application Priority Data

Sep. 19, 2017    (JP) .............................. JP2017-178619

(51) Int. Cl.
*H03H 9/02* (2006.01)
*H03H 9/05* (2006.01)
(Continued)

(52) U.S. Cl.
CPC ...... *H03H 9/02448* (2013.01); *H03H 9/0595* (2013.01); *H03H 9/1057* (2013.01); *H03H 9/2452* (2013.01)

(58) Field of Classification Search
CPC .............. H03H 9/02448; H03H 9/0595; H03H 9/1057; H03H 9/2452; H03H 9/2489
See application file for complete search history.

(56) References Cited

U.S. PATENT DOCUMENTS

2006/0158283 A1*  7/2006  Hikita ................... H03H 9/178
                                                                    333/187
2016/0322953 A1   11/2016  Takeyama
(Continued)

FOREIGN PATENT DOCUMENTS

WO    2015108125 A1    7/2015
WO    2016158048 A1   10/2016
(Continued)

OTHER PUBLICATIONS

International Search Report issued for PCT/JP2018/018121, dated Jul. 10, 2018.
(Continued)

*Primary Examiner* — Jeffrey M Shin
(74) *Attorney, Agent, or Firm* — Arent Fox LLP (57) ABSTRACT

A resonator is provided that includes a vibration portion having a first and second electrodes, a piezoelectric film disposed therebetween and having a first face opposing the first electrode, and at least two temperature characteristic adjustment films formed to oppose the first face of the piezoelectric film with the first electrode interposed therebetween. Moreover, the resonator includes a frame that surrounds at least part of the vibration portion; and a holding arm connecting the vibration portion to the holding portion. The vibration portion includes a surface opposing the first face of the piezoelectric film and having first and second regions in which an average amount of displacement is larger than an average amount of displacement in the first region when the vibration portion vibrates.

20 Claims, 9 Drawing Sheets

(51) Int. Cl.
　　　*H03H 9/10*　　　(2006.01)
　　　*H03H 9/24*　　　(2006.01)

(56) References Cited

U.S. PATENT DOCUMENTS

2018/0034441 A1　2/2018　Hirota et al.
2018/0048284 A1　2/2018　Nakamura et al.

FOREIGN PATENT DOCUMENTS

| WO | 2016159022 A1 | 10/2016 |
| WO | 2016175218 A1 | 11/2016 |

OTHER PUBLICATIONS

Written Opinion of the International Searching Authority issued for PCT/JP2018/018121, dated Jul. 10, 2018.

* cited by examiner

RESONATOR AND RESONANCE DEVICE

CROSS REFERENCE TO RELATED APPLICATIONS

The present application is a continuation of PCT/JP2018/018121 filed May 10, 2018, which claims priority to Japanese Patent Application No. 2017-178619, filed Sep. 19, 2017, the entire contents of each of which are incorporated herein by reference.

TECHNICAL FIELD

The present invention relates to resonators and resonance devices.

BACKGROUND

Currently, resonators using the Micro Electro Mechanical Systems (MEMS) technology are used as timing devices, for example. In general, this type of resonator is mounted on a printed circuit board to be incorporated in an electronic apparatus such as a smartphone. Moreover, various attempts have been made to improve temperature coefficients of frequency (TCF) of the MEMS resonators.

For example, Patent Document 1 (identified below) discloses a piezoelectric MEMS resonator in which a main surface is covered with two types of adjustment films. In the resonator disclosed in Patent Document 1, an adjustment film having a small mass reduction speed by etching is formed in a region (e.g., spring portion) which plays a role of a spring in the resonator. On the other hand, an adjustment film having a high mass reduction speed is formed in a region where an amount of displacement in the resonator is large. Furthermore, Patent Document 1 discloses that, by forming a film having a low mass reduction speed in the spring portion, a change in temperature characteristics by etching can be suppressed.

Patent Document 1: International Publication No. WO 2015/108125.

However, in the conventional resonator of Patent Document 1, temperature characteristics are unfavorably changed by the influence of frequency adjustment. Therefore, further improvement is needed in order to adjust the frequency temperature characteristics with high precision.

SUMMARY OF THE INVENTION

Accordingly, the exemplary embodiments of the present invention address such circumstances. Thus, it is an object of the present invention to adjust the frequency temperature characteristics of a resonator with high precision.

In an exemplary aspect, a resonator is provided that includes a vibration portion having a first electrode and a second electrode, a piezoelectric film formed between the first electrode and the second electrode and having a first face opposing the first electrode, and at least two temperature characteristic adjustment films formed opposing the first face of the piezoelectric film with the first electrode interposed therebetween. Moreover, a holding portion or frame surrounds at least part of the vibration portion, and a holding arm connects the vibration portion to the holding portion. The vibration portion includes a surface opposing the first face of the piezoelectric film, and the surface is formed of a first region and a second region in which an average amount of displacement is larger than an average amount of displacement in the first region when the vibration portion vibrates during operation. The temperature characteristic adjustment films include a first temperature characteristic adjustment film having a positive temperature coefficient of frequency and a second temperature characteristic adjustment film having a negative temperature coefficient of frequency that are exposed in different regions of the first region.

According to the exemplary embodiment of the present invention, the frequency temperature characteristics of a resonator can be adjusted with high precision.

DETAILED DESCRIPTION OF EMBODIMENTS

First Exemplary Embodiment

Figure 1:
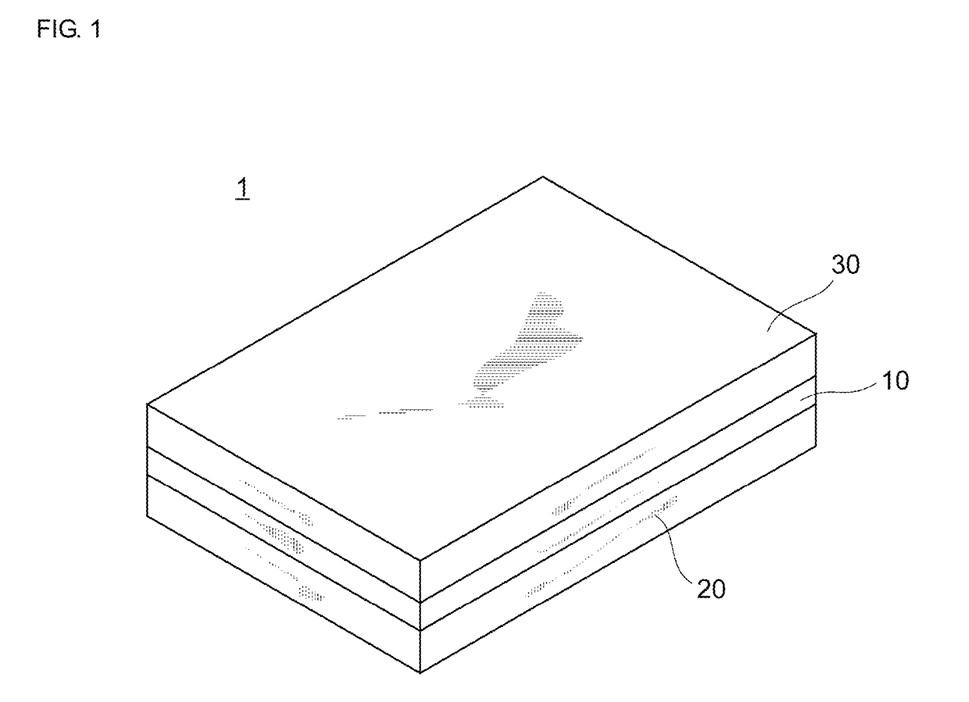
FIG. 1 is a perspective view schematically illustrating an external appearance of a resonance device according to a first exemplary embodiment.
Figure 2:
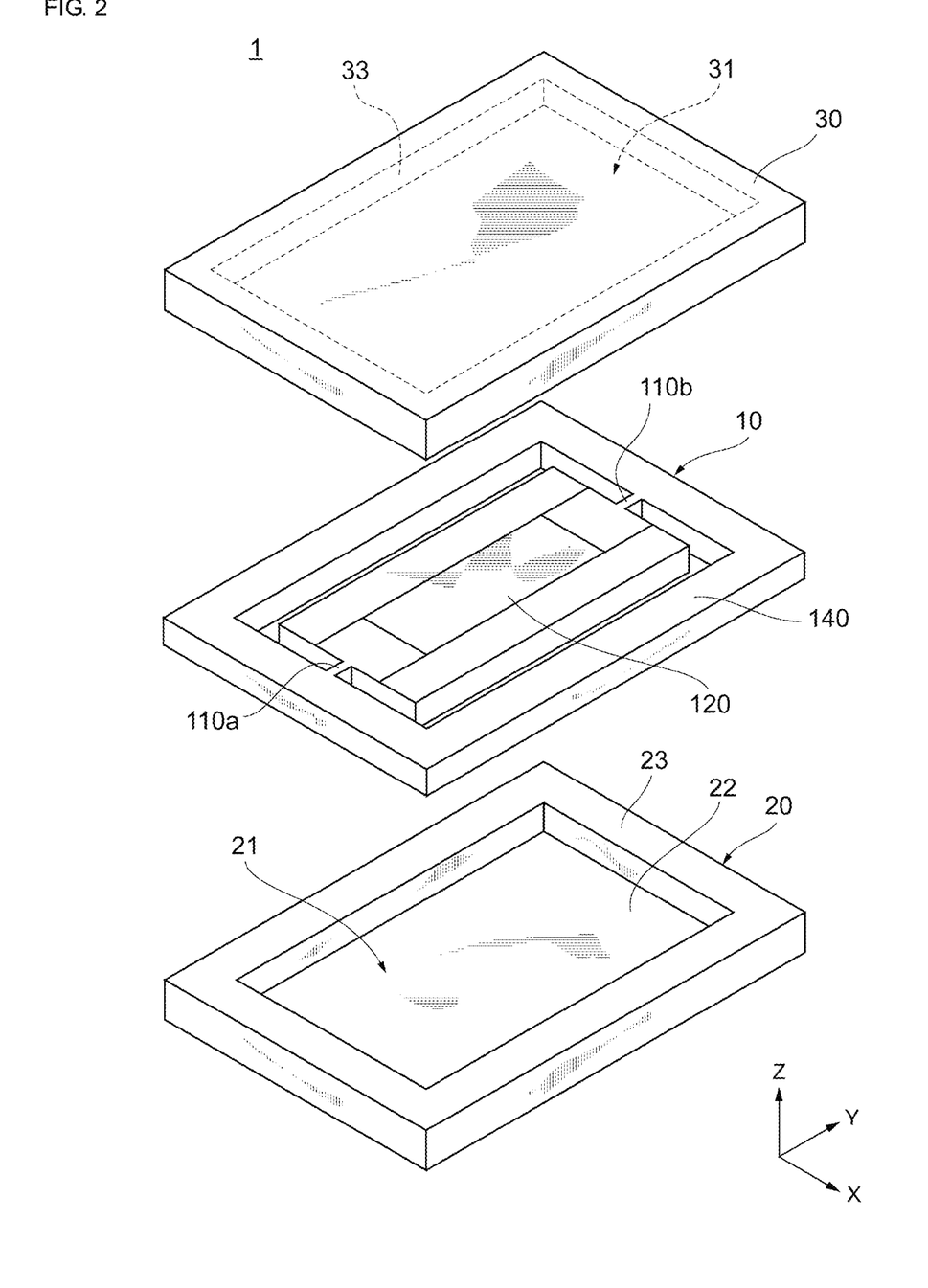
FIG. 2 is an exploded perspective view schematically illustrating a structure of a resonance device according to the first exemplary embodiment.

Hereinafter, a first exemplary embodiment will be described with reference to the accompanying drawings. FIG. 1 is a perspective view schematically illustrating an external appearance of a resonance device 1 according to the first embodiment. FIG. 2 is an exploded perspective view schematically illustrating a structure of the resonance device 1 according to the first embodiment.

As shown, the resonance device 1 includes a resonator 10, and an upper lid 30 and a lower lid 20 provided sandwiching the resonator 10 therebetween. That is, the resonance device 1 is formed by laminating the lower lid 20, the resonator 10, and the upper lid 30 in that order.

Further, the resonator 10, the lower lid 20, and the upper lid 30 are joined to each other, whereby the resonator 10 is sealed and a vibration space of the resonator 10 is formed. The resonator 10, the lower lid 20, and the upper lid 30 are each formed by using an Si substrate in an exemplary aspect. The resonator 10, the lower lid 20, and the upper lid 30 are joined to each other by the Si substrates thereof being joined to each other. The resonator 10 and the lower lid 20 may be formed by using an SOI substrate.

In an exemplary aspect, the resonator 10 is a MEMS resonator manufactured by using the MEMS technology. In the present embodiment, a case in which the resonator 10 is formed by using a silicon substrate (Si substrate) is exemplified and described. However, it is noted that the silicon substrate is not limited to a substrate formed of only a silicon material, and also includes a substrate doped with an N-type semiconductor material such as phosphorus (P) (for example, a substrate formed of a degenerate semiconductor), as will be described later.

Hereinafter, elements of the resonance device 1 will be described in detail.

Upper Lid 30

The upper lid 30 extends in a plate-like shape along an XY plane, and a recess 31 having a flat rectangular parallelepiped shape, for example, is formed in a rear surface thereof. The recess 31 is surrounded by a side wall 33, and forms part of the vibration space, which is a space where the resonator 10 vibrates.

Lower Lid 20

The lower lid 20 includes a bottom plate 22 having a rectangular plate-like shape and provided along the XY plane, and a side wall 23 extending from a peripheral edge portion of the bottom plate 22 in a Z axis direction (that is, in a lamination direction of the lower lid 20 and the resonator 10). In the lower lid 20, a recess 21 formed by a surface of the bottom plate 22 and an inner surface of the side wall 23 is provided in a surface opposing the resonator 10. The recess 21 forms part of the vibration space of the resonator 10. With the upper lid 30 and the lower lid 20, the vibration space is hermetically sealed, and a vacuum state is maintained for the resonator 10. Moreover, the vibration space may be filled with gas such as an inert gas in an exemplary aspect.

Resonator 10

Figure 3A:
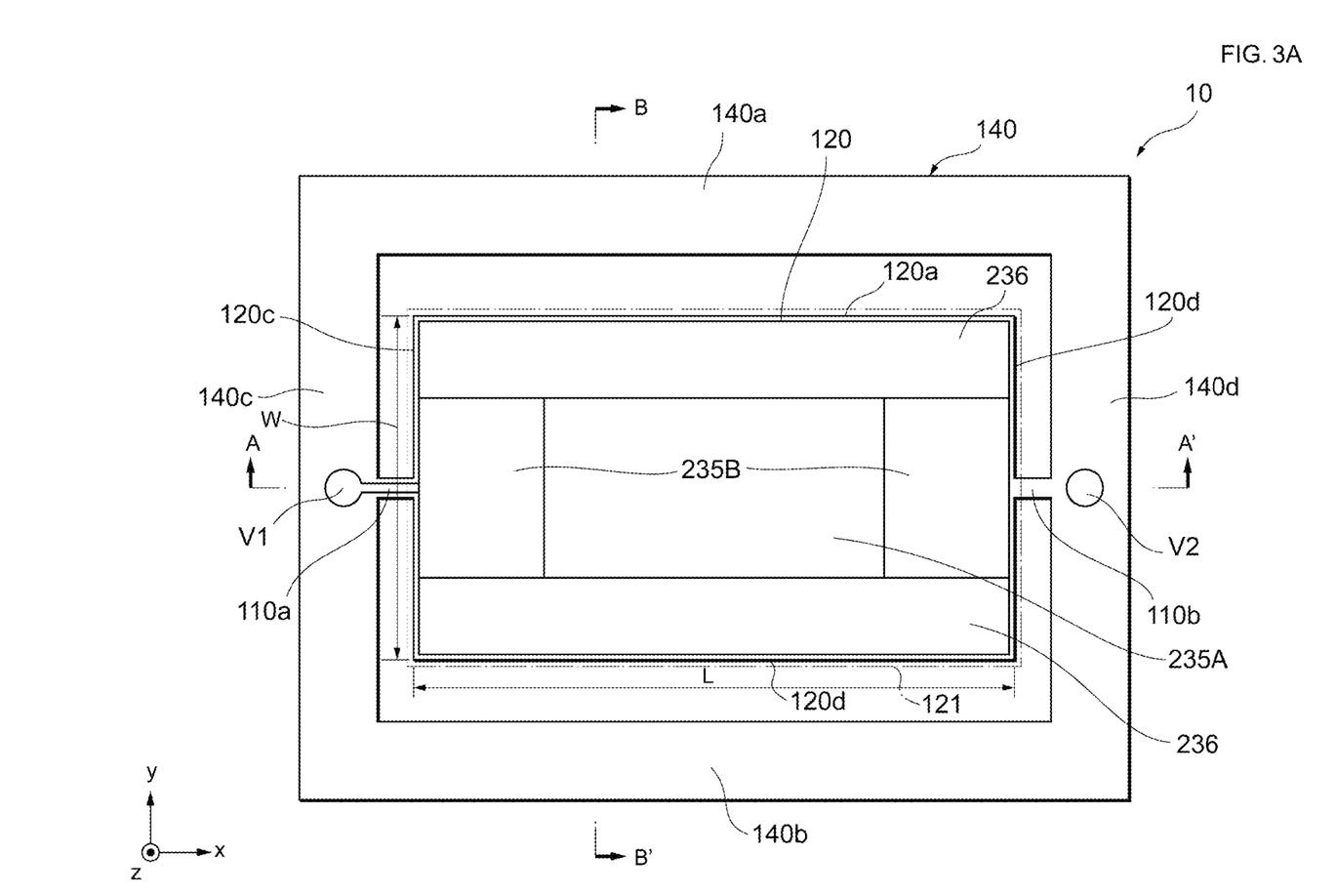
FIG. 3A is a plan view of a resonator according to the first exemplary embodiment, in which an upper substrate is detached.

FIG. 3A is a plan view schematically illustrating a structure of the resonator 10 according to the present embodiment. As shown the resonator 10 includes a vibration portion 120, a holding portion 140, and holding arms 110a and 110b (hereinafter, also collectively referred to as "holding arm 110").

Vibration Portion 120

In the exemplary aspect, the vibration portion 120 has a rectangular contour extending along the XY plane in an orthogonal coordinate system in FIG. 3A. The vibration portion 120 is provided on an inner side of the holding portion 140, and there is formed a space between the vibration portion 120 and the holding portion 140 at a predetermined interval. As will be described later with reference to FIGS. 4(A) and 4(B), the vibration portion 120 includes an Si substrate F2, a lower electrode E1 (i.e., an example of a second electrode), a piezoelectric thin film F3 (i.e., an example of a piezoelectric film), and an upper electrode E2 (i.e., an example of a first electrode).

As further shown, the vibration portion 120 includes one upper electrode E2 formed in a rectangular plate-like shape on a surface thereof (e.g., FIG. 4A) having a lengthwise direction and a width direction. In FIG. 3A, the vibration portion 120 has a long side in an X axis direction and a short side in a Y axis direction, and the upper electrode E2 has a long side in the X axis direction and a short side in the Y axis direction.

Figure 4A:
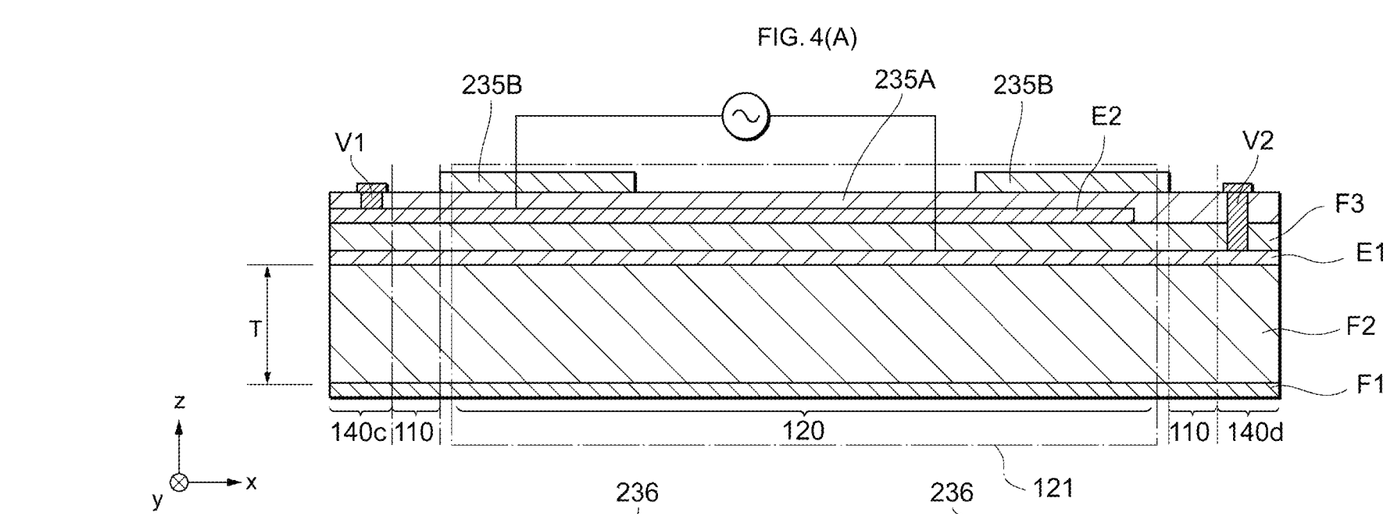
FIGS. 4(A) and 4(B) include cross-sectional views taken along an A-A' line and a B-B' line, respectively, in FIG. 3A.
Figure 4B:
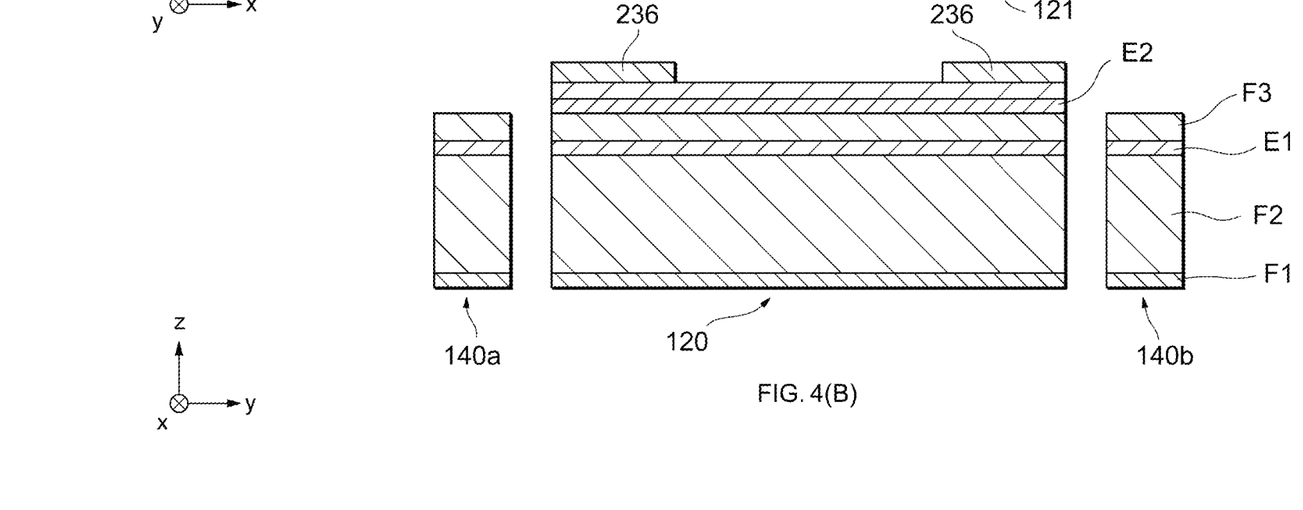

The vibration portion 120 has a vibration region 121 corresponding to the upper electrode E2 (see FIG. 4(A)), the detail of which will be described below with reference to FIGS. 4(A) and 4(B). In the present embodiment, the vibration portion 120 includes the one upper electrode E2 having a face opposing a surface of the Si substrate F2, and includes one vibration region 121 corresponding to the upper electrode E2. The vibration region 121 is so configured as to perform contour vibration in the Y axis direction in the vibration portion 120 while taking, as a node, a region connecting a connection area with the holding arm 110, which will be described later. Further, the vibration region 121 has a long side parallel to the node of the contour vibration of the vibration portion 120 and a short side orthogonal to the node of the contour vibration and corresponding to a half wave length of the contour vibration. In the exemplary embodiment, the vibration region 121 substantially coincides with the contour of the vibration portion 120. That is, in the exemplary embodiment, a length L of the vibration region 121 corresponds to a distance of the vibration portion 120 in a direction along the node of the vibration, and a width W of the vibration region 121 corresponds to a distance of the vibration portion 120 in a direction orthogonal to the node of the vibration. Moreover, the length L of the vibration region 121 is equal to or more than about 58 μm and equal to or less than about 234 μm, and the width W is equal to or more than about 40 μm and equal to or less than about 160 μm in an exemplary aspect. Since the vibration region 121 is coincident with the vibration portion 120, the long side of the vibration portion 120 is, similarly to the length L, equal to or more than about 58 μm and equal to or less than about 234 μm, and the short side thereof is, similarly to the width W, equal to or more than about 40 μm and equal to or less than about 160 μm in the exemplary aspect.

Figure 3B:
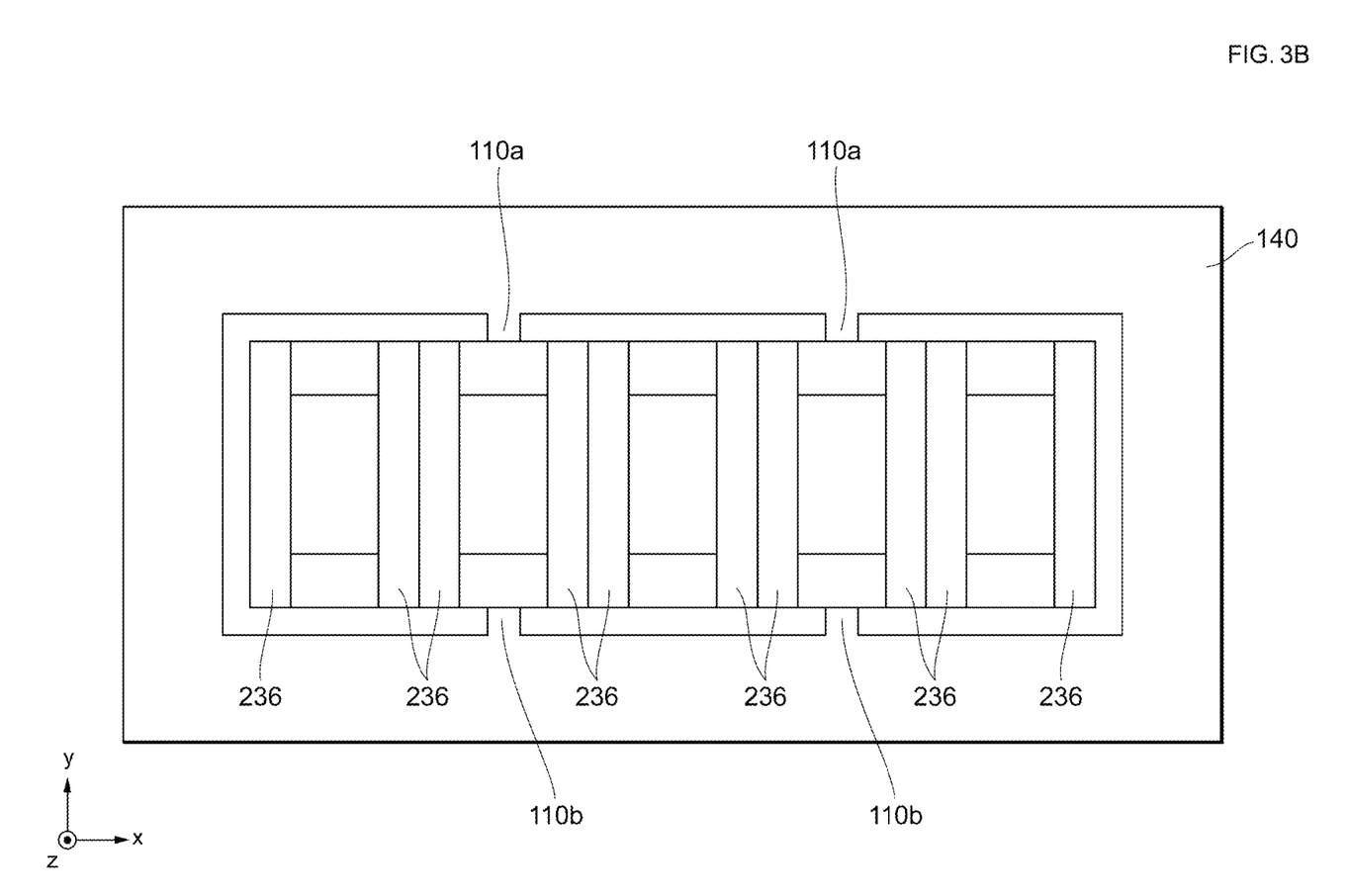
FIG. 3B is another example of a plan view of a resonator according to the first exemplary embodiment, in which an upper substrate is detached.

The vibration portion 120 may include a plurality of upper electrodes E2, and in this case, the vibration portion 120 may include a plurality of vibration regions 121 that are divided in accordance with the number of the plurality of upper electrodes E2. The width W of the vibration region 121 in this case corresponds to a size obtained by dividing the distance of the vibration portion 120 into the number of upper electrodes in the direction orthogonal to the vibration node (see, e.g., FIG. 3B).

The surface of the vibration portion 120 (a face opposing the upper lid 30; an example of a surface opposing a first face) is formed of a first region and a second region. The first region is a region including the node (e.g., the spring or spring portion) of the vibration of the vibration portion 120, and the second region is a region in which an average amount of displacement of the vibration is larger than that in the first region when the vibration portion 120 vibrates upon excitation. Moreover, in the exemplary embodiment, the second region is an edge region of the vibration portion 120, and the first region is a region other than the second region.

According to an exemplary embodiment, a temperature characteristic adjustment film 235A (an example of a second temperature characteristic adjustment film) is formed (or otherwise disposed) on the surface of the vibration portion 120 to cover substantially the entire surface thereof. Moreover, the temperature characteristic adjustment film 235A is a layer of an insulator having a negative temperature coefficient of frequency. The film having a negative temperature coefficient of frequency is a film having characteristics where the frequency is lowered with the rise of temperature.

Further, a temperature characteristic adjustment film 235B (an example of a first temperature characteristic adjustment film) and a frequency adjustment film 236 are formed (or otherwise disposed) on a surface of the temperature characteristic adjustment film 235A to cover part thereof.

The frequency adjustment film 236 is formed on the temperature characteristic adjustment film 235A in such a manner as to expose the surface of the film 236 in at least part of a region (i.e., the second region) where the average amount of displacement by the vibration is larger than that of other regions in the vibration portion 120. Specifically, the frequency adjustment film 236 is formed in the edge region of the vibration portion 120. In the exemplary embodiment, the frequency adjustment film 236 is formed in a belt-like shape across the edge region at each end along the long side of the vibration portion 120.

Moreover, the temperature characteristic adjustment film 235B is formed so that the surface thereof is exposed in part of the vibration node (i.e., the first region) in the vibration portion 120. In the present embodiment, the temperature characteristic adjustment film 235B is so formed as to be exposed in a region between the regions where the frequency adjustment film 236 is exposed, at each end portion in the lengthwise direction of the vibration portion 120. In the exemplary embodiment, the temperature characteristic adjustment film 235B is a layer of an insulator having a positive temperature coefficient of frequency. The film having a positive temperature coefficient of frequency is a film having characteristics where the frequency is increased with the rise of temperature.

The temperature characteristic adjustment film 235B is formed by adjusting an area ratio with the temperature characteristic adjustment film 235A so that the temperature characteristics of the resonator become 0 (e.g., canceled each other out) at a desired frequency. The locations where the temperature characteristic adjustment film 235A and the temperature characteristic adjustment film 235B are respectively formed may be replaced with each other in alternative aspects. It is sufficient that the temperature characteristic adjustment film 235A and the temperature characteristic adjustment film 235B are respectively exposed in the first region, and that they do not necessarily overlap each other in an exemplary aspect. Further, the number of types of the temperature characteristic adjustment films exposed in the surface of the vibration portion 120 is not limited to two, and may be any number of equal to or greater than three. Moreover, the number of types of the frequency adjustment films exposed in the surface of the vibration portion 120 is not limited to one, and may be any number of equal to or greater than two.

As will be described in detail later, the resonator 10 according to the present embodiment performs contour vibration in which vibrations along the width direction serve as main vibrations when a voltage is applied thereto. At this time, a vibration node is generated in a region connecting central portions in the width direction.

The frequency temperature characteristics of the resonator 10 are easily influenced by the film thickness of the film formed in the vibration node (i.e., the spring or spring portion). On the other hand, the resonant frequency is easily influenced by the film thickness of the film formed in a region where the displacement of the vibration is large (e.g., the mass part, such as the four corners of the vibration portion 120). Since the exemplary resonator 10 includes two types of films having different temperature coefficients of frequency in the spring portion, the frequency temperature characteristics can be adjusted with high precision in the exemplary aspect. Further, by having the film for frequency adjustment in the mass part, frequency can also be adjusted with high precision.

Holding Portion 140

The holding portion 140 (also referred to as a frame) is formed in a rectangular frame shape along the XY plane. The holding portion 140 is so provided as to surround an outer side portion of the vibration portion 120 along the XY plane in a plan view. In exemplary aspects, it is sufficient that the holding portion 140 is provided on at least part of the periphery of the vibration portion 120, and the shape thereof is not limited to a complete frame shape. For example, it is sufficient that the holding portion 140 is provided on the periphery of the vibration portion 120 in such a manner as to hold the vibration portion 120 and to be joined with the upper lid 30 and the lower lid 20.

Moreover, in the present embodiment, the holding portion 140 is formed of frame bodies 140a, 140b, 140c, and 140d. As illustrated in FIG. 2, the frame bodies 140a to 140d have prismatic shapes formed integrally. As illustrated in FIG. 3A, the frame bodies 140a and 140b extend parallel to the X axis direction while opposing the long sides of the vibration portion 120. The frame bodies 140c and 140d extend parallel to the Y axis direction while opposing the short sides of the vibration portion 120, and are respectively connected to both ends of the frame bodies 140a and 140b.

The frame bodies 140c and 140d are connected in the vicinity of the center thereof by the holding arm 110. Further, the frame bodies 140c and 140d are provided with terminals V1 and V2, respectively, in the vicinity of the connection area with the holding arm 110. The terminal V1 is a terminal for connecting the upper electrode E2 (see, e.g., to FIG. 4(A)) to the outside. The terminal V2 is a terminal for connecting, to the outside, the lower electrode E1 to be described later. When the upper electrode E2 is divided in a higher-order mode or the like, the terminal V1 is connected to one upper electrode, and the terminal V2 is connected to the other upper electrode.

Holding Arm 110

The holding arms 110a and 110b (hereinafter, also collectively referred to as "holding arm 110") are prismatic-shaped arms, and are each provided in a space between the short side of the vibration portion 120 and the frame body 140c or 140d, at the inner side of the holding portion 140. The holding arms 110a and 110b connect the short sides of the vibration portion 120 to the frame bodies 140c and 140d, respectively.

On a surface of the holding arm 110a, the upper electrode E2 is formed across from the vibration portion 120 to the frame body 140c.

Lamination Structure

The lamination structure of the resonator 10 will be described with reference to FIGS. 4(A) and 4(B). FIG. 4(A) is a cross-sectional view taken along an A-A' line in FIG. 3A, and FIG. 4(B) is a cross-sectional view taken along a B-B' line in FIG. 3A.

In the resonator 10 according to the exemplary embodiment, the holding portion 140, the vibration portion 120, and the holding arm 110 are integrally formed by the same process, for example. As illustrated in FIG. 4(A) and FIG. 4(B), in the resonator 10, the lower electrode E1 (an example of a second electrode) is laminated first on the silicon (Si) substrate F2 (an example of a substrate). On the lower electrode E1, the piezoelectric thin film F3 (an example of a piezoelectric film) is laminated to cover the lower electrode E1, and further the upper electrode E2 (an example of a first electrode) is laminated on the piezoelectric thin film F3. The piezoelectric thin film F3 and the upper electrode E2 each have a face (an example of a first face) opposing each other.

Moreover, in an exemplary aspect, the Si substrate F2 is formed of a degenerate n-type Si semiconductor having a thickness of about 10 μm, for example, and may include phosphorus (P), arsenic (As), antimony (Sb), or the like as n-type dopant. A resistance value of the degenerate Si used for the Si substrate F2 is, for example, equal to or greater than about 0.53 mΩ·cm and equal to or smaller than about 0.56 mΩ·cm. Thus, it is possible for the degenerate Si layer to also serve as the lower electrode E1. A thickness T of the Si substrate F2 is, for example, equal to or greater than about 20 μm and equal to or smaller than about 30 μm.

Further, a temperature characteristic correction layer F1 made of silicon oxide (for example, $SiO_2$) is formed on a lower surface of the Si substrate F2. This makes it possible to improve the temperature characteristics.

In the present embodiment, the temperature characteristic correction layer F1 refers to a layer having a function of reducing a temperature coefficient of frequency in the vibration portion 120 (that is, a rate of change per temperature) at least near the normal temperature when the temperature correction layer F1 is formed on the Si substrate F2 in comparison with a case where the temperature characteristic correction layer F1 is not formed on the Si substrate F2. Since the vibration portion 120 includes the temperature characteristic correction layer F1, changes in the resonant frequency can be reduced, in response to the temperature, of the laminated structure of the Si substrate F2, the lower electrode E1, the upper electrode E2, the piezoelectric thin film F3, and the temperature correction layer F1, for example. In the exemplary embodiment, the temperature characteristic correction layer F1 has a thickness of equal to or greater than about 0.2 μm and equal to or smaller than about 1.0 μm, for example.

In the resonator 10, the temperature characteristic correction layer F1 is preferably formed to have a uniform thickness. The uniform thickness refers to a situation where a variation in thickness of the temperature characteristic correction layer F1 falls within a range of ±20% from the average value of the thickness, which may vary due to the manufacturing process, for example.

The temperature characteristic correction layer F1 may be formed on the upper surface of the Si substrate F2, or may be formed on both the upper surface and the lower surface of the Si substrate F2. In the exemplary embodiment, at least the vibration portion 120 and holding arm 110 are formed integrally with the same Si substrate F2 and the same temperature characteristic correction layer F1. It is also noted that in the holding portion 140, the temperature characteristic correction layer F1 may not be formed on the lower surface of the Si substrate F2.

The upper electrode E2 and the lower electrode E1 are formed by using molybdenum (Mo), aluminum (Al), or the like. By using degenerate Si for the Si substrate F2, the Si substrate F2 may also serve as the lower electrode E1. That is, when the Si substrate F2 has a function as the lower electrode, the configuration of the lower electrode E1 may be omitted in an exemplary aspect. The thickness of the lower electrode E1 is about 0.1 μm, for example, and the thickness of the upper electrode E2 is about 0.2 for example.

The upper electrode E2 and the lower electrode E1 are formed to have desired shapes by etching or the like. The lower electrode E1 is so formed as to function as the lower electrode on the vibration portion 120, for example. The lower electrode E1 is formed on the holding arm 110, the holding portion 140, and the like in such a manner as to function as wiring for connecting the lower electrode to an AC power supply provided outside the resonator 10 via the terminal V2.

On the other hand, the upper electrode E2 is so formed as to function as the upper electrode on the vibration portion 120. The upper electrode E2 is formed on the holding arm 110, the holding portion 140, and the like in such a manner as to function as wiring for connecting the upper electrode to an AC power supply provided outside the resonator 10 via the terminal V1.

The terminal V2 is formed to be connected to the lower electrode E1 through a via formed in the piezoelectric thin film F3 to be described later. The terminal V1 is formed on the upper electrode E2. The terminals V1 and V2 are formed by using, for example, molybdenum (Mo) or aluminum (Al).

For the connection from the AC power supply to the terminals V1 and V2, a configuration in which an electrode is formed on an outer surface of the upper lid 30 (an example of an outer electrode) and this electrode connects the AC power supply as an external power supply to the lower or upper wiring may be employed, or a configuration in which a via is formed in the upper lid 30 and the interior of the via is filled with a conductive material to provide wiring, and this wiring connects the AC power supply to the lower or upper wiring may be employed.

In the exemplary embodiment, the piezoelectric thin film F3 is a thin film of a piezoelectric body configured to transform an applied voltage into vibrations, and may contain, for example, nitride such as aluminum nitride (AlN) or oxide as a main ingredient. Specifically, the piezoelectric thin film F3 may be formed with scandium aluminum nitride (ScAlN). ScAlN is a material in which part of aluminum in aluminum nitride is replaced with scandium. The piezoelectric thin film F3 has a thickness of, for example, about 0.8 μm.

The temperature characteristic adjustment film 235A is a layer of an insulator having a negative temperature coefficient of frequency, and is formed with a material in which the speed of mass reduction by etching is slower than that of the frequency adjustment film 236. Specifically, the temperature characteristic adjustment film 235A is formed with AlN. The mass reduction speed is represented by the product of the etching speed (e.g., thickness removed per unit time) and the density.

Moreover, in an exemplary aspect, the temperature characteristic adjustment film 235B is a layer of an insulator having a positive temperature coefficient of frequency, and is formed with a material in which the speed of mass reduction by etching is slower than that of the frequency adjustment film 236. For example, the temperature characteristic adjustment film 235B is preferably formed with a material having a property (e.g., a temperature coefficient of elastic modulus) by which hardness increases with an increase in temperature. Specifically, the temperature characteristic adjustment film 235B is formed of a silicon oxide film such as $SiO_2$, for example.

Moreover, the frequency adjustment film 236 is a layer of a conductor, and is formed with a material in which the speed of mass reduction by etching is faster than that of the temperature characteristic adjustment films 235A and 235B. The frequency adjustment film 236 is formed with, for example, a metal such as molybdenum (Mo), tungsten (W), gold (Au), platinum (Pt), nickel (Ni), aluminum (Al), or titanium (Ti).

As long as the temperature characteristic adjustment films 235A and 235B, and the frequency adjustment film 236 have the above-described relationship of mass reduction speeds, any relationship of magnitude of etching speeds may be employed as should be appreciated to one skilled in the art.

The frequency adjustment film 236 and the temperature characteristic adjustment film 235B are formed on substantially the entire surface of the vibration portion 120, and then are adjusted to be disposed only in a predetermined region by processing such as etching, for example.

Function of Resonator

Next, the function (i.e., operation) of the vibration portion 120 will be described. As illustrated in FIG. 4(A), the vibration portion 120 includes the vibration region 121. In the vibration region 121, the piezoelectric thin film F3 expands and contracts in an in-plane direction of the XY plane, that is, in the Y axis direction in accordance with a voltage applied to the piezoelectric thin film F3 by the upper electrodes E2 and the lower electrode E1. Specifically, the piezoelectric thin film F3 is oriented in the c-axis direction. Due to this configuration, when a predetermined voltage is applied to the upper electrode E2 and the lower electrode E1 to form a predetermined potential difference between the upper electrode E2 and the lower electrode E1, the piezoelectric thin film F3 expands and contracts in the XY in-plane direction in accordance with the above potential difference, whereby the vibration region 121 performs contour vibration.

Characteristic Adjustment Process

Next, the functions of the temperature characteristic adjustment films 235A and 235B and the frequency adjustment film 236 will be described. In the exemplary resonance device 1, after the formation of the resonator 10 as described above, a temperature characteristic adjustment process and a frequency adjustment process are carried out. It is noted that either of the temperature characteristic adjustment process and the frequency adjustment process can be performed first and that the order is not particularly limited.

The temperature characteristic adjustment process is a process of adjusting the frequency temperature characteristics of the resonator 10. In the temperature characteristic adjustment process, the film thicknesses of the temperature characteristic adjustment films 235A and 235B are adjusted by etching with a gas cluster ion beam (GCIB), for example. At this time, a film thickness change of the film (e.g., the temperature characteristic adjustment film 235B in the present embodiment) having a positive temperature coefficient of elastic modulus is adjusted to become larger than a film thickness change of the film (e.g., the temperature characteristic adjustment film 235A in the present embodiment) having a negative temperature coefficient of elastic modulus.

In the frequency adjustment process, the resonant frequency of the resonator 10 is first measured, and then a deviation with respect to the target frequency is calculated. Next, the film thickness of the frequency adjustment film 236 is adjusted based on the calculated frequency deviation. The adjustment of the film thickness of the frequency adjustment film 236 may be performed by, for example, irradiating the entire surface of the resonance device 1 with an argon (Ar) ion beam to etch the frequency adjustment film 236. Further, when the film thickness of the frequency adjustment film 236 is adjusted, it is preferable to clean the resonator 10 and remove the scattered film.

In the frequency adjustment process, the thicknesses of the temperature characteristic adjustment films 235A and 235B are also changed. Accordingly, when the temperature characteristic adjustment process is carried out prior to the frequency adjustment process, the area ratio of the temperature characteristic adjustment films 235A and 235B is designed so that the change in the frequency temperature characteristics in the frequency adjustment process becomes substantially zero.

As described above, since the exemplary resonator 10 includes two types of films having different temperature coefficients of frequency in the spring portion, the frequency temperature characteristics can be adjusted with high precision. Further, by having the film for frequency adjustment in the mass part, the frequency can also be adjusted with high precision.

Second Exemplary Embodiment

In the second and subsequent embodiments, descriptions of the elements common to those in the first embodiment will be omitted, and only different points will be described. In particular, similar effects brought by similar configurations will not be described one by one for each embodiment.

Figure 5:
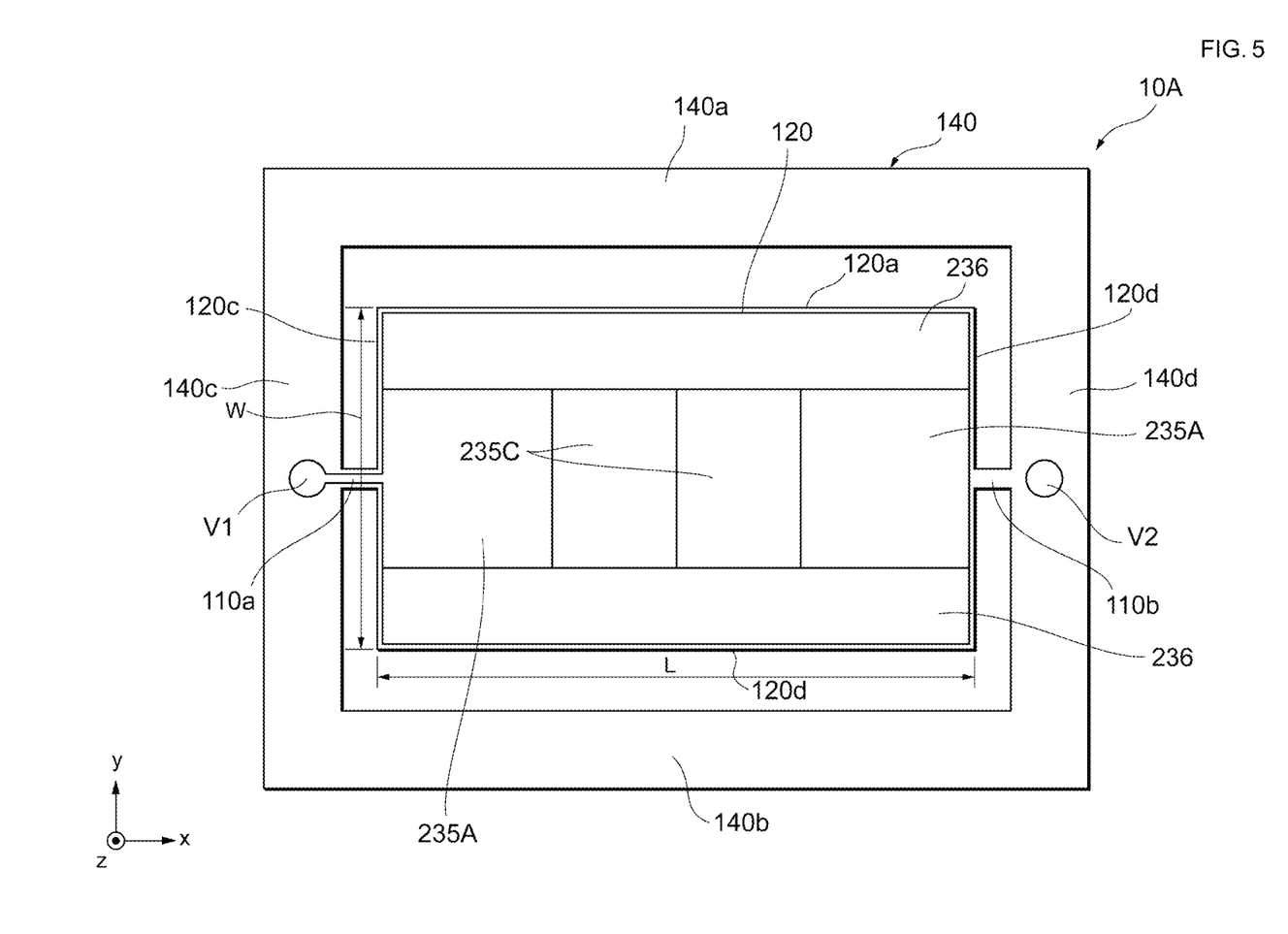
FIG. 5 is a plan view of a resonator according to a second exemplary embodiment.

The structure and function of a resonator 10A according to the second embodiment will be described with reference to FIG. 5. FIG. 5 is a diagram illustrating an example of a plan view of the resonator 10A according to the second exemplary embodiment. As shown the resonator 10A includes a temperature characteristic adjustment film 235C in place of the temperature characteristic adjustment film 235B in the first embodiment.

The temperature characteristic adjustment film 235C is formed to cover part of a vibration node in a vibration portion 120. In this embodiment, the temperature characteristic adjustment film 235C is formed in a region between the regions where a frequency adjustment film 236 is exposed, in a central portion in the lengthwise direction of the vibration portion 120. The temperature characteristic adjustment film 235C has the same configuration as that of the temperature characteristic adjustment film 235B except for the formation position thereof.

Other elements and functions are the same as those of the first embodiment.

Third Exemplary Embodiment

Figure 6:
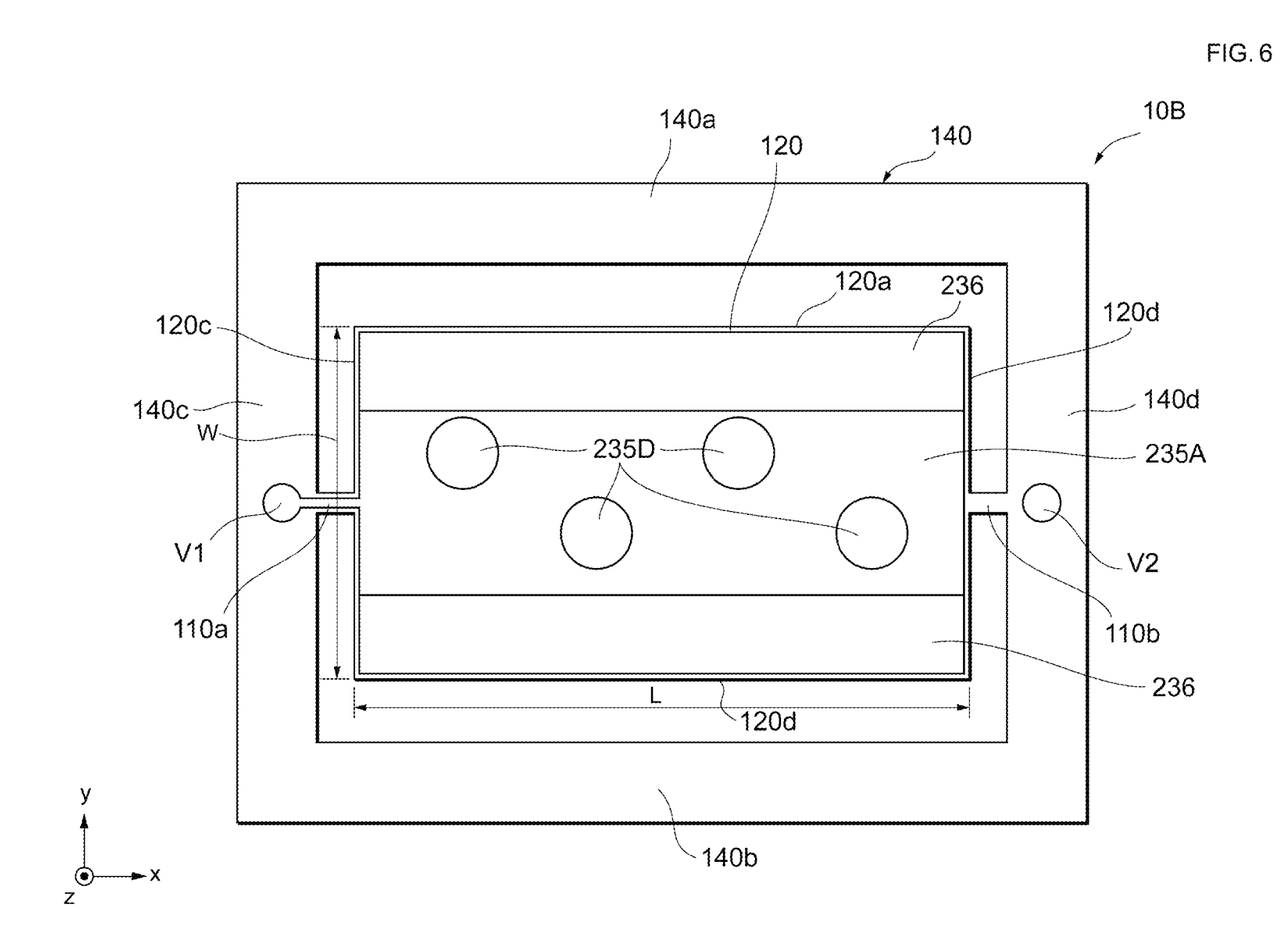
FIG. 6 is a plan view of a resonator according to a third exemplary embodiment.

The structure and function of a resonator 10B according to a third embodiment will be described with reference to FIG. 6. FIG. 6 is a diagram illustrating an example of a plan view of the resonator 10B according to the third exemplary embodiment. As shown the resonator 10B includes a temperature characteristic adjustment film 235D in place of the temperature characteristic adjustment film 235B in the first embodiment.

A temperature characteristic adjustment film 235D is formed to cover part of a vibration node in a vibration portion 120. In the present embodiment, the temperature characteristic adjustment film 235D is formed in a spot shape in a region between the regions where a frequency adjustment film 236 is exposed. The temperature characteristic adjustment film 235D has the same configuration as that of the temperature characteristic adjustment film 235B except for the formation position thereof. It is noted that while circular or spot shapes of the temperature characteristic adjustment film 235D are shown in this embodiment, other shapes can also be provided according to variations of the exemplary embodiment.

Other elements and functions are the same as those of the first exemplary embodiment.

Fourth Exemplary Embodiment

Figure 7:
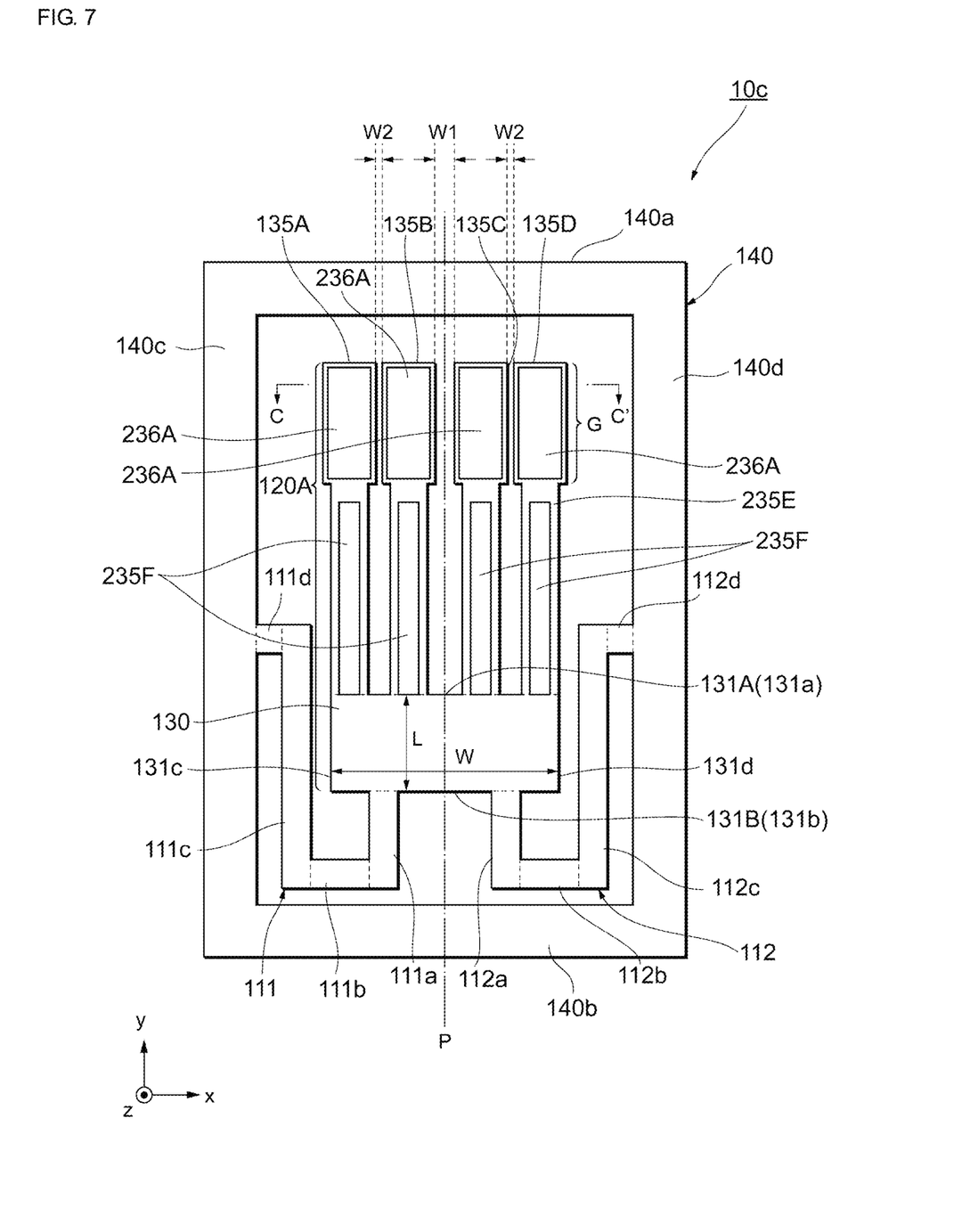
FIG. 7 is a plan view of a resonator according to a fourth exemplary embodiment.
Figure 8:
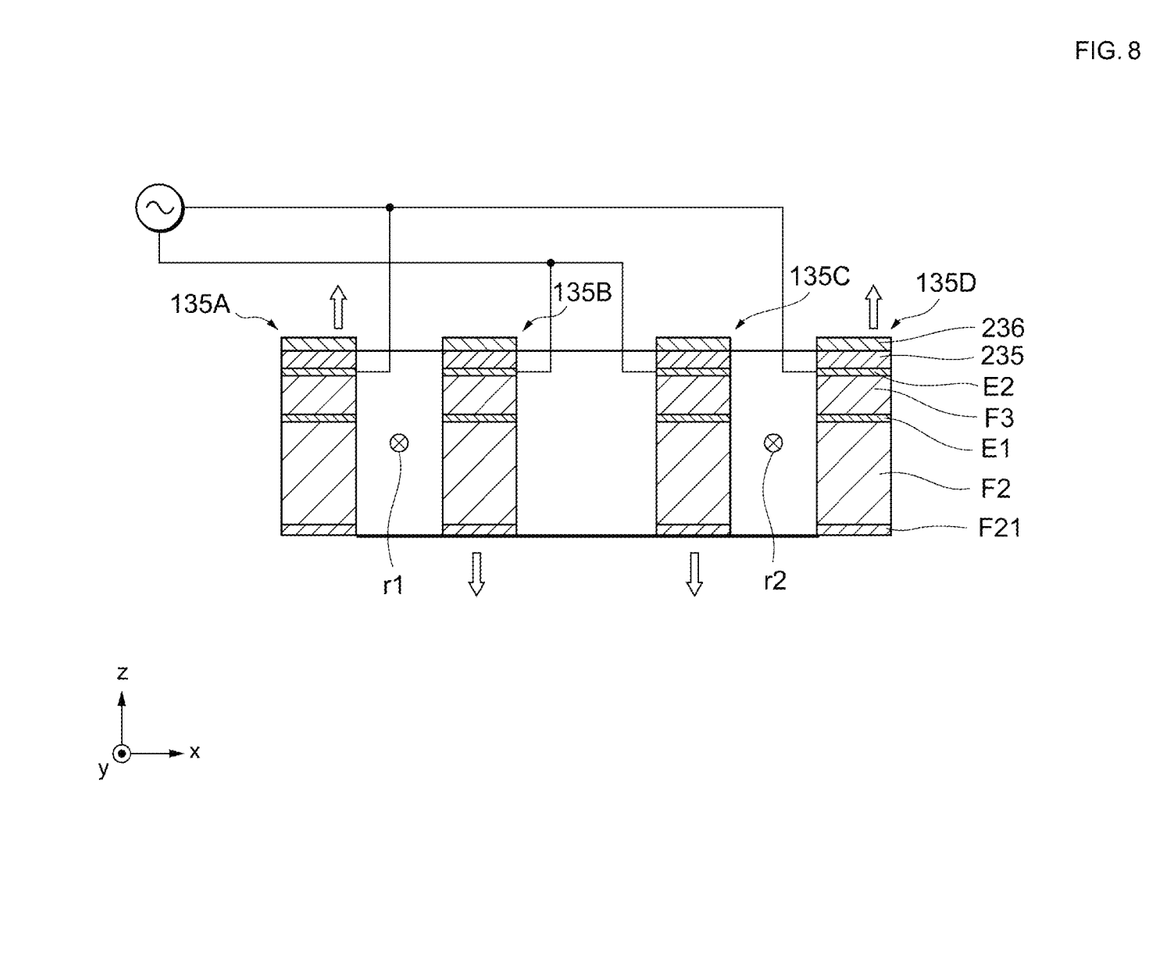
FIG. 8 is a cross-sectional view taken along a C-C' line in FIG. 7.

The structure and function of a resonator 10C according to a fourth embodiment will be described with reference to FIGS. 7 and 8. FIG. 7 is a diagram illustrating an example of a plan view of the resonator 10C according to the present embodiment. FIG. 8 is a cross-sectional view taken along a C-C' line in FIG. 7. As illustrated in FIG. 7, the resonator 10C includes a vibration portion 120A in place of the vibration portion 120 in the first embodiment, and includes holding arms 111 and 112 in place of the holding arm 110.

The vibration portion 120A has a rectangular contour extending along the XY plane in an orthogonal coordinate system illustrated in FIG. 7. Moreover, the vibration portion 120A is provided on an inner side of a holding portion 140, and there is formed a space between the vibration portion 120A and the holding portion 140 at a predetermined interval. In the example of FIG. 7, the vibration portion 120A includes a base section 130, four vibration arms 135A to 135D (also collectively referred to as "vibration arm 135"), a frequency adjustment film 236A, and temperature characteristic adjustment films 235E and 235F. It is noted that the number of vibration arms is not limited to four, and may be set to any number of one or more, for example. In the present embodiment, each vibration arm 135 and the base section 130 are formed integrally.

Base Section 130

In a plan view, the base section 130 has long sides 131a and 131b in the X axis direction, and short sides 131c and 131d in the Y axis direction. The long side 131a is one side of a front end face 131A (hereinafter also referred to as a "front end 131A") of the base section 130, and the long side 131b is one side of a rear end face 131B (hereinafter also referred to as a "rear end 131B") of the base section 130. In the base section 130, the front end 131A and the rear end 131B are provided to oppose each other.

Moreover, the base section 130 is connected to the vibration arm 135, which will be described later, at the front end 131A, and is also connected to the holding arms 111 and 112, which will be described later, at the rear end 131B. In the example of FIG. 7, the base section 130 has a substantially rectangular shape in a plan view, but is not limited thereto, and may be formed to be substantially plane-symmetric with respect to a virtual plane P defined along a perpendicular bisector of the long side 131a. For example, the base section 130 may have a trapezoidal shape in which the long side 131b is shorter than the long side 131a, or may have a semicircular shape in which the long side 131a is a diameter thereof. Further, each face of the base section 130 is not limited to a flat one, and may be a curved one. The virtual plane P is a plane including a center axis passing through the center in a direction in which the vibration arms 135 are arranged in the vibration portion 120A.

In the base section 130, a base section length L (e.g., the length of the short sides 131c and 131d in FIG. 7), which is the longest distance between the front end 131A and the rear end 131B in a direction from the front end 131A toward the rear end 131B, is about 35 μm, for example. Moreover, a base section width W (e.g., the length of the long sides 131a and 131b in FIG. 7), which is the longest distance between side ends of the base section 130 in a width direction orthogonal to the base section length direction, is about 265 μm, for example.

Vibration Arm 135

The vibration arms 135 extend in the Y axis direction and have the same size. Each of the vibration arms 135 is provided between the base section 130 and the holding portion 140 in parallel to the Y axis direction, and one end thereof is connected to the front end 131A of the base section 130 to be a fixed end, while the other end thereof (that opposes the fixed end) is an open end. The vibration arms 135 are provided in parallel with each other at a predetermined interval in the X axis direction. The vibration arm 135 has a width in the X axis direction of about 50 μm and a length in the Y axis direction of about 465 μm, for example.

Each vibration arm 135 has a weight portion G at the open end thereof. The weight portion G is wider in the X axis direction than the other portions of the vibration arm 135. The weight portion G has a width in the X axis direction of about 70 μm, for example. The weight portion G is integrally formed with the vibration arm 135 by the same process. By forming the weight portion G, the weight per unit length is heavier at the open end side than that at the fixed end side in the vibration arm 135. Accordingly, since each vibration arm 135 has the weight portion G at the open end side, the amplitude of vibration in the up-down direction can be increased in each vibration arm.

In the vibration portion 120A of the present embodiment, two vibration arms 135A and 135D are disposed at outer side portions in the X axis direction, and two vibration arms 135B and 135C are disposed at inner side portions in the X axis direction. Moreover, an interval W1 between the vibration arms 135B and 135C in the X axis direction is set to be larger than an interval W2 between the vibration arm 135A (135D) of the outer side portion and the vibration arm 135B (135C) of the inner side portion adjacent to the vibration arm 135A (135D) of the outer side portion in the X axis direction. The interval W1 is, for example, about 30 μm, while the interval W2 is, for example, about 25 μm. By setting the interval W2 to be smaller than the interval W1, vibration characteristics are improved. However, when it is attempted to miniaturize the resonance device 1, the interval W1 may be set to be smaller than the interval W2, or may be set to be equal to the interval W2, for example.

Temperature Characteristic Adjustment Film 235E

The temperature characteristic adjustment film 235E is formed on a surface of the vibration portion 120A (i.e., a face opposing the upper lid 30) to cover the entire surface thereof. Moreover, the temperature characteristic adjustment film 235E do not necessarily need to cover the entire surface of the vibration portion 120A, but preferably cover the entire surface of the vibration portion 120A in order to protect an underlying electrode film (for example, the upper electrode E2 in FIG. 4(A)) and a piezoelectric film (for example, the piezoelectric thin film F3 in FIG. 4(A)) from being damaged during the frequency adjustment. Other elements of the temperature characteristic adjustment film 235E are the same as those of the temperature characteristic adjustment film 235A.

Frequency Adjustment Film 236A

The frequency adjustment film 236A is formed on part of a surface of the temperature characteristic adjustment film 235E in each of the vibration arms 135A to 135D. The resonant frequency of the vibration portion 120A may be adjusted by the temperature characteristic adjustment film 235E and the frequency adjustment film 236A.

The frequency adjustment film 236A is formed on the temperature characteristic adjustment film 235E in such a manner as to expose the surface thereof in at least part of a region where the amount of displacement due to the vibration is relatively large compared to other regions in the vibration portion 120A. Specifically, the frequency adjustment film 236A is formed at the tip of the vibration arm 135, that is, formed on the weight portion G. In the present embodiment, the frequency adjustment film 236A is formed up to the tip of the vibration arm 135, so that the temperature characteristic adjustment film 235E is not exposed at all in the tip area. However, a structure can also be provided in which the frequency adjustment film 236A is not formed in the tip area of the vibration arm 135 so that part of the temperature characteristic adjustment film 235E is exposed. Other elements of the frequency adjustment film 236A are the same as those of the frequency adjustment film 236 in the first embodiment.

Temperature Characteristic Adjustment Film 235F

The temperature characteristic adjustment film 235F is formed to cover part of a vibration node (e.g., the vicinity of a connection area between the vibration arm 135 and the base section 130 in the present embodiment) in the vibration arm 135. Specifically, the temperature characteristic adjustment film 235F is formed near the center in the width direction of the vibration arm 135 extending from the vicinity of the connection area between the vibration arm 135 and the base section 130 to the vicinity of the region where the weight portion G is formed. The temperature characteristic adjustment film 235F is not formed on the entire surface in the width direction of the vibration arm 135, and the temperature characteristic adjustment film 235E is exposed at the end portion in the width direction of the vibration arm 135. Other elements of the temperature characteristic adjustment film 235F are the same as those of the temperature characteristic adjustment film 235B in the first embodiment.

Holding Arms 111 and 112

The holding arm 111 and the holding arm 112 are provided on the inner side of the holding portion 140, and connect the rear end 131B of the base section 130 to frame bodies 140c and 140d. As illustrated in FIG. 7, the holding arm 111 and the holding arm 112 are formed substantially plane-symmetric with respect to a virtual plane P defined in parallel with the YZ plane along the center line in the X axis direction of the base section 130.

As shown, the holding arm 111 includes arms 111a, 111b, 111c, and 111d. The holding arm 111 has one end connected to the rear end 131B of the base section 130, and extends therefrom toward a frame body 140b. Then, the holding arm 111 is bent in a direction toward the frame body 140c (that is, in the X axis direction), is further bent in a direction toward a frame body 140a (that is, in the Y axis direction), and is bent in the direction toward the frame body 140c again (that is, in the X axis direction) to have the other end thereof connected to the frame body 140c.

The arm 111a is provided between the base section 130 and the frame body 140b to oppose the frame body 140c with the lengthwise direction being parallel to the Y axis. The arm 111a has one end connected to the base section 130 at the rear end 131B, and extends therefrom substantially perpendicular to the rear end 131B, that is, extends in the Y axis direction. An axis passing through the center in the X axis direction of the arm 111a is preferably provided on the inner side relative to the center line of the vibration arm 135A, and in the example of FIG. 7, the arm 111a is disposed between the vibration arms 135A and 135B. The other end of the arm 111a is connected to one end of the arm 111b at a side surface thereof. The arm 111a has a width of about 20 µm defined in the X axis direction, and a length of about 25 µm defined in the Y axis direction, for example.

The arm 111b is provided between the base section 130 and the frame body 140b to oppose the frame body 140b with the lengthwise direction being parallel to the X axis direction. The arm 111b has one end connected to the side surface, as the other end of the arm 111a, on a side opposing the frame body 140c, and extends therefrom substantially perpendicular to the arm 111a, that is, extends in the X axis direction. The other end of the arm 111b is connected to a side surface, as one end of the arm 111c, on a side opposing the vibration portion 120A. The arm 111b has a width of about 20 µm defined in the Y axis direction, and a length of about 92 µm defined in the X axis direction, for example.

The arm 111c is provided between the base section 130 and the frame body 140c to oppose the frame body 140c with the lengthwise direction being parallel to the Y axis direction. The one end of the arm 111c is connected to the other end of the arm 111b at the side surface thereof, and the other end thereof is connected to a side surface, as one end of the arm 111d, on the opposite side of the frame body 140c. The arm 111c has a width of about 20 µm defined in the X axis direction, and a length of about 255 µm defined in the Y axis direction, for example.

The arm 111d is provided between the base section 130 and the frame body 140c to oppose the frame body 140a with the lengthwise direction being parallel to the X axis direction. The one end of the arm 111d is connected to the side surface, as the other end of the arm 111c, on the side opposing the frame body 140c. The arm 111d has the other end connected to the frame body 140c at a position opposing the vicinity of the connection area between the vibration arm 135A and the base section 130, and extends therefrom substantially perpendicular to the frame body 140c, that is, extends in the X axis direction. The arm 111d has a width of about 50 µm defined in the Y axis direction, and a length of about 5 µm defined in the X axis direction, for example.

As described above, the holding arm 111 is connected to the base section 130 at the arm 111a, is bent at the connection area between the arms 111a and 111b, at the connection area between the arms 111b and 111c, and at the connection area between the arms 111c and 111d, and thereafter is connected to the holding portion 140.

Similar to holding arm 111, the holding arm 112 includes arms 112a, 112b, 112c, and 112d. The holding arm 112 has one end connected to the rear end 131B of the base section 130, and extends therefrom toward the frame body 140b. Then, the holding arm 112 is bent in a direction toward the frame body 140d (that is, in the X axis direction), is further bent in a direction toward the frame body 140a (that is, in the Y axis direction), and is bent in the direction toward the frame body 140d again (that is, in the X axis direction) to have the other end thereof connected to the frame body 140d.

Since the arms 112a, 112b, 112c, and 112d are symmetrically configured with the arms 111a, 111b, 111c, and 111d, detailed description thereof will be omitted herein.

The function of the resonator 10C will be described with reference to FIG. 8. In the exemplary embodiment, the phase of a voltage applied to the vibration arms 135A and 135D of the outer side portions and the phase of a voltage applied to the vibration arms 135B and 135C of the inner side portions are set to be opposite to each other. With this configuration, the vibration arms 135A and 135D of the outer side portions and the vibration arms 135B and 135C of the inner side portions are respectively displaced in the opposite directions during excitation. For example, when the free ends of the vibration arms 135A and 135D of the outer side portions are displaced toward an inner surface of the upper lid 30, whereas the free ends of the vibration arms 135B and 135C of the inner side portions are displaced toward an inner surface of the lower lid 20 during operation. It is noted that in the resonator 10C, the lower electrode E1 is in a float state. Moreover, to stabilize the frequency, the lower electrode may be extended to another terminal and connected to an external ground electrode.

Accordingly, in the resonator 10C according to the exemplary embodiment, the following situation takes place at the time of opposite-phase vibrations: that is, the vibration arm 135A and the vibration arm 135B, illustrated in FIG. 3A, respectively vibrate in the opposite up-down directions about a first center axis extending parallel to the Y axis between the vibration arm 135A and the vibration arm 135B. Further, the vibration arm 135C and the vibration arm 135D respectively vibrate in the opposite up-down directions about a second center axis extending parallel to the Y axis between the vibration arm 135C and the vibration arm 135D. As a result, torsional moments are generated with respect to the first center axis and the second center axis in the opposite directions to each other, and bending vibration is generated in the base section 130.

Other elements and functions of the resonator 10 are the same as those of the first embodiment.

Exemplary embodiments of the present invention have been described above. For example, the exemplary resonator 10 includes the vibration portion 120 having the upper electrode E2 and the lower electrode E1, the piezoelectric thin film F3 formed between the upper electrode E2 and the lower electrode E1 and having a first face opposing the upper electrode E2, and at least two temperature characteristic adjustment films 235A and 235B formed opposing the first face of the piezoelectric thin film F3 with the upper electrode E2 interposed therebetween. Moreover, the holding portion 140 is provided to surround at least part of the vibration portion 120; and the holding arm 110 connects the vibration portion 120 and the holding portion 140. The vibration portion 120 includes a surface opposing the first face of the piezoelectric thin film F3, and the surface is formed of a first region and a second region in which an average amount of displacement is larger than an average amount of displacement in the first region when the vibration portion 120 vibrates. The at least two temperature characteristic adjustment films 235A and 235B include the temperature characteristic adjustment film 235B having a positive temperature coefficient of frequency and the temperature characteristic adjustment film 235A having a negative temperature coefficient of frequency that are exposed in different regions of the first region. With this, since the resonator 10 includes two types of films having different temperature coefficients of frequency in the spring portion, the frequency temperature characteristics can be adjusted with high precision.

In an exemplary aspect, it is preferable for the vibration portion 120 to further include at least one frequency adjustment film 236 exposed in the second region. According to this preferable form, since the mass part is provided with a film for frequency adjustment, it is also possible to adjust the frequency with high precision.

In an exemplary aspect, it is preferable that the vibration portion 120 include at least one rectangular vibration region 121 in which the piezoelectric thin film F3 performs contour vibration in accordance with a voltage applied to the piezoelectric thin film F3, and which has a long side parallel to a node of the contour vibration of the piezoelectric thin film F3 and a short side being orthogonal to the node of the contour vibration of the piezoelectric thin film F3 and that corresponds to a half wavelength of the contour vibration, and that the second region be an edge region of the vibration region 121. It is also preferable that the first region be a region where the node of the contour vibration is formed in the vibration region 121.

In yet another exemplary aspect, the vibration portion 120 preferably includes the vibration arm 135, which has a fixed end and an open end and performs bending vibration, and the base section 130 has a front end connected to the fixed end of the vibration arm 135 and a rear end opposing the front end, and that the second region is a tip on the open end side of the vibration arm 135. In addition, it is preferable for the first region to be a region in the vibration arm 135 where the vibration arm 135 and the base section 130 are connected. Further, it is preferable for a vibration mode of the vibration portion 120 to be out-of-plane bending vibration or in-plane bending vibration.

It is also preferable for the temperature characteristic adjustment film 235B to have a positive temperature coefficient of elastic modulus. In this aspect, the temperature characteristic adjustment film 235B has a higher degree of hardness in proportion to the temperature. As a result, a favorable resonant frequency may be obtained.

Further, it is preferable for the frequency adjustment film to have relative density larger than that of the temperature characteristic adjustment films 235A and 235B. As a result, a favorable resonant frequency may be obtained.

According to an exemplary embodiment, the resonance device 1 includes the resonator 10 described above. Thus, the frequency temperature characteristics can be adjusted with high precision.

It is noted that the exemplary embodiments described above are intended to facilitate understanding of the present invention, and are not intended to limit interpretation of the present invention. The exemplary embodiments of the present invention may be modified and/or improved without departing from the spirit and scope of the invention, and the present invention includes its equivalents. That is, products achieved by design change on the aforementioned embodiments carried out appropriately by those skilled in the art, are also included in the scope of the present invention as long as the products are provided with the features of the present invention. For example, the elements included in the exemplary embodiments, and their arrangement, materials, conditions, shapes, sizes and the like are not limited to the exemplified ones, and may be modified as appropriate. It is to be noted that the embodiments are merely illustrative, and it is needless to say that it is possible to partially replace or combine the configurations described in the different embodiments, and that these are also included within the scope of the present invention as long as they include the features of the present invention.

REFERENCE SIGNS LIST

1 RESONANCE DEVICE
10, 10A-10C RESONATOR
30 UPPER LID
20 LOWER LID
140 HOLDING PORTION
140a-140d FRAME BODY
110, 111, 112 HOLDING ARM
120, 120A VIBRATION PORTION
F2 Si SUBSTRATE
235A-235E TEMPERATURE CHARACTERISTIC ADJUSTMENT FILM
236, 236A FREQUENCY ADJUSTMENT FILM

The invention claimed is:

1. A resonator comprising:
a vibration portion that includes:
  first and second electrodes,
  a piezoelectric film disposed between the first and second electrodes and having a first face that opposes the first electrode, and
  at least two temperature characteristic adjustment films that oppose the first face of the piezoelectric film with the first electrode interposed therebetween;
a frame that surrounds at least part of the vibration portion; and
at least one holding arm that connects the vibration portion to the holding portion,
wherein the vibration portion includes a surface opposing the first face of the piezoelectric film, and that includes a first region and a second region having an average amount of displacement that is larger than an average amount of displacement of the first region during vibration of the vibration portion, and wherein the at least two temperature characteristic adjustment films include a first temperature characteristic adjustment film having a positive temperature coefficient of frequency and a second temperature characteristic adjustment film having a negative temperature coefficient of frequency that are exposed in different regions of the first region of the surface of the vibration portion.

2. The resonator according to claim 1, wherein the vibration portion further includes at least one frequency adjustment film exposed in the second region of the surface of the vibration portion.

3. The resonator according to claim 2, wherein the frequency adjustment film has relative density greater than relative densities of the first temperature characteristic adjustment film and the second temperature characteristic adjustment film.

4. The resonator according to claim 1, wherein the first temperature characteristic adjustment film has a positive temperature coefficient of elastic modulus.

5. The resonator according to claim 1, wherein the vibration portion includes a rectangular vibration region in which the piezoelectric film is configured to perform contour vibration when a voltage is applied to the piezoelectric film.

6. The resonator according to claim 5, wherein the rectangular vibration region of the vibration portion has a long side parallel to a node of the contour vibration of the piezoelectric film and a short side that is orthogonal to the node of the contour vibration of the piezoelectric film and corresponds to a half wavelength of the contour vibration.

7. The resonator according to claim 6, wherein the second region includes at least part of an edge region of the vibration region.

8. The resonator according to claim 7, wherein the first region includes at least part of a region where the contour vibration node is formed in the vibration region.

9. The resonator according to claim 1, wherein the vibration portion includes at least one vibration arm that has a fixed end and an open end and is configured to perform bending vibration, and a base having a front end connected to the fixed end of the vibration arm and a rear end that opposes the front end.

10. The resonator according to claim 9, wherein the second region includes at least part of a tip region on a side of the open end of the at least one vibration arm.

11. The resonator according to claim 10, wherein the first region includes at least part of a region where the at least one vibration arm and the base are connected in the at least one vibration arm.

12. The resonator according to claim 10, wherein the vibration portion is configured to perform an out-of-plane bending vibration.

13. The resonator according to claim 10, wherein the vibration portion is configured to perform an in-plane bending vibration.

14. The resonator according to claim 1, wherein the second temperature characteristic adjustment film is disposed to cover an entirety of the surface of the vibration portion.

15. The resonator according to claim 14, wherein the first temperature characteristic adjustment film and a frequency adjustment film are disposed on a surface of the second temperature characteristic adjustment film that opposes the vibration portion.

16. The resonator according to claim 15, wherein the second temperature characteristic adjustment film comprises a rectangular shape with the first temperature characteristic adjustment film extending along respective shorter sides of the second temperature characteristic adjustment film and the frequency adjustment film extending along respective longer sides of the second temperature characteristic adjustment film.

17. A resonator comprising:
a vibration portion that includes first and second electrodes with a piezoelectric film disposed therebetween, with the vibration portion including a first surface region and a second surface region that has an average amount of displacement that is larger than an average amount of displacement of the first surface region during vibration of the vibration portion;
a frame that surrounds at least part of the vibration portion;
at least one holding arm that connects the vibration portion to the holding portion; and
at least two temperature characteristic adjustment films disposed above the first electrode opposite the piezoelectric film, and that includes a first temperature characteristic adjustment film that has a positive temperature coefficient of frequency and a second temperature characteristic adjustment film that has a negative temperature coefficient of frequency,
wherein the at least two temperature characteristic adjustment films are exposed in different regions of the first surface region of the vibration portion.

18. The resonator according to claim 17, wherein the vibration portion further includes at least one frequency adjustment film exposed in the second surface region of the vibration portion.

19. A resonance device comprising:
a resonator including comprising:
a vibration portion that includes:
first and second electrodes,
a piezoelectric film disposed between the first and second electrodes, and
at least two temperature characteristic adjustment films disposed above the first electrode;
wherein the vibration portion includes a surface opposing the piezoelectric film, and that includes a first region and a second region having an average amount of displacement that is larger than an average amount of displacement of the first region during vibration of the vibration portion, and
wherein the at least two temperature characteristic adjustment films include a first temperature characteristic adjustment film having a positive temperature coefficient of frequency and a second temperature characteristic adjustment film having a negative temperature coefficient of frequency, with the first and second temperature characteristic adjustment film being exposed in different regions of the first region of the surface of the vibration portion;
a lid body that covers the resonator; and
an outer electrode electrically coupled to at least one of the first and second electrode.

20. The resonance device according to claim 19, wherein the vibration portion further includes at least one frequency adjustment film exposed in the second region of the surface of the vibration portion.

* * * * *